United States Patent [19]

Shinohara et al.

[11] 4,358,552

[45] Nov. 9, 1982

[54] EPOXY RESINOUS MOLDING COMPOSITIONS HAVING LOW COEFFICIENT OF THERMAL EXPANSION AND HIGH THERMAL CONDUCTIVITY

[75] Inventors: Makoto Shinohara, Crystal Lake; James J. Miyashiro, Woodstock, both of Ill.

[73] Assignee: Morton-Norwich Products, Inc., Chicago, Ill.

[21] Appl. No.: 185,765

[22] Filed: Sep. 10, 1981

[51] Int. Cl.$^3$ .......................................... C08L 63/00
[52] U.S. Cl. .................................... 523/443; 428/413
[58] Field of Search .................. 260/37 EP; 428/413; 523/443

[56] References Cited

U.S. PATENT DOCUMENTS 4,038,491  7/1977  Gamble et al. ............... 260/37 EP
4,043,969  8/1977  Sporck .......................... 260/37 EP

FOREIGN PATENT DOCUMENTS 48-44179  12/1973  Japan .
49-38718  10/1974  Japan .

Primary Examiner—Lewis T. Jacobs
Attorney, Agent, or Firm—Jack Axelrood

[57] ABSTRACT

An improved epoxy molding composition for encapsulating microelectronic devices wherein the molding composition, after conversion to a thermoset condition, i.e., infusible state, by the application of heat and pressure, displays a low coefficient of thermal expansion and a high thermal conductivity. The dual properties of low coefficient of thermal expansion and high thermal conductivity are imparted to the molding composition by the incorporation therein of a specific anisotropic, polycrystalline, sintered ceramic product which is relatively non-abrasive and free of ionic contaminants and which has cordierite as its primary phase, consisting essentially on an analytical oxide basis of 11.5 to 16.5% RO, 33 to 41% $Al_2O_3$ and 46.6 to 53% $SiO_2$.

10 Claims, No Drawings

EPOXY RESINOUS MOLDING COMPOSITIONS HAVING LOW COEFFICIENT OF THERMAL EXPANSION AND HIGH THERMAL CONDUCTIVITY

BACKGROUND OF THE INVENTION

1. Field of the Invention

The field of this invention is that of epoxy molding compositions suitable as encapsulants for electrical and electronic devices, particularly for microelectronic components such as semiconductors.

2. Description of the Prior Art

Electrical and electronic devices have been encapsulated in a variety of resinous materials, including epoxy, silicone and phenolic materials. Thus, it is known to provide epoxy resinous molding compositions which comprise epoxy resin, hardener therefor and inorganic filler as the essential ingredients thereof, to which various adjuvants such as catalysts, mold release agents, pigments, flame retardants and coupling agents may be added.

The following performance characteristics are required of resinous encapsulants for microelectronic devices:

a. good device compatability, with no chemical, physical and electrical interference of performance of semiconductor devices by the plastic encapsulant used;
b. adequate sealing of leads to prevent penetration of moisture and ionic contaminants along leads;
c. low moisture penetration through the encapsulant;
d. low level of ionic contaminants such as $Li^+$, $Na^+$, $K^+$, and $Cl^-$;
e. High glass transition temperature;
f. Low coefficient of thermal expansion;
g. High thermal conductivity;
h. Long term dimensional stability.

While the requirements listed in a, b, c, d, e and h are largely fulfilled by epoxy resins cured or hardened with anhydrides, phenol formaldehyde condensates, cresol formaldehyde condensates, polyamines or combinations thereof, with or without catalysts and coupling agents, the crucial factors of low coefficient of thermal expansion and high thermal conductivity, together with the required low level of ionic contaminants and minimal abrasiveness are influenced directly and significantly by the choice of the inorganic filler or fillers.

The importance of a low coefficient of thermal expansion in an epoxy molding composition cannot be overemphasized. The tremendous progress in the microelectronics industry has enabled the production of semiconductor chips of increasing size, functionality, complexity and circuit density. Such large semiconductor chips are more vulnerable to thermally-induced stress than the small, simpler chips, with the result that the use of an encapsulant composition which does not have a low coefficient of thermal expansion causes premature failure due to cracking of chips, wire breakage, cracking of passivation layer and parametric shift. Such defects are all related to a large thermally induced internal stress, the result of a high, rather than a low, coefficient of thermal expansion of the epoxy molding composition employed.

In addition to the requirement of a low coefficient of thermal expansion, it is equally important that the epoxy molding composition for encapsulating semiconductor devices have a high thermal conductivity. Semiconductor devices of high circuit density generate more heat per unit area than devices of low circuit density, requiring the rapid dissipation of heat through the encapsulant in order to insure cool operation and a long operating life. It is widely accepted in the electronics industry that an increase of 10° C. in junction temperature decreases the life expectancy of a semiconductor device by one half. Therefore, the property of high thermal conductivity, i.e., rapid dissipation of heat, is necessary to the efficient operation and long life of a microelectronic device.

The inorganic fillers currently in use for epoxy molding compositions include fused silica, $\alpha$-quartz, alumina, fiber glass, calcium silicate, a variety of earths and clays, and various combinations thereof. These fillers, which are present to the extent of from about 40 to about 80 percent by weight of the total epoxy composition, exert the greatest influence on the properties of coefficient of thermal expansion and thermal conductivity. Thus, fused silica exhibits a low coefficient of thermal expansion. Unfortunately, this same filler also has a low thermal conductivity. It must therefore be used in conjunction with a filler having a high thermal conductivity to provide these dual properties.

Another widely used filler is $\alpha$-quartz, which exhibits a high thermal conductivity, but also a high coefficient of thermal expansion, requiring that it be used in combination with a filler of low coefficient of thermal expansion to overcome this deficiency.

Although alumina does exhibit the dual properties of a low coefficient of thermal expansion and a high thermal conductivity, its excessive abrasiveness precludes its use as it causes an unacceptably excessive and rapid wear of manufacturing and molding equipment.

The prior art fails to disclose a practical, useable filler which possesses a low coefficient of thermal expansion, which is here defined to be less than $23 \times 10^{-6}/°C$. below the glass transition temperature, and at the same time a high thermal conductivity, here defined as one greater than $25 \times 10^{-4}$ cal./°C. per centimeter per second. The procedures for determining the coefficient of thermal expansion and the thermal conductivity are described hereinafter in Example 1.

Accordingly, it would be desirable to provide an improved epoxy molding composition containing a filler which exhibits the dual properties of a low coefficient of thermal expansion and a high thermal conductivity and which filler is relatively non-abrasive and free of ionic contaminants.

It is therefore the principal object of this invention to provide an improved epoxy molding composition which contains a filler which contributes to the composition the dual properties of a low coefficient of thermal expansion and a high thermal conductivity and which is relatively non-abrasive and free of ionic contaminants.

SUMMARY OF THE INVENTION

Broadly, the present invention relates to an improved epoxy molding composition capable of conversion to a thermoset condition upon the application of heat and pressure and suitable for encapsulating microelectronic devices, where the composition comprises an epoxy resin, a hardener therefor and from about 40% to about 80% by weight of filler, wherein the improvement resides in the use of from about 25% to about 100% by weight of the filler of a specific anisotropic, polycrystalline sintered ceramic product.

This product is characterized by having cordierite as its primary phase and consisting essentially on a analytical oxide basis of 11.5 to 16.5% RO, 33 to 41% $Al_2O_3$ and 46.6 to 53% $SiO_2$ and having a coefficient of thermal expansion in at least one direction of less than $11.0\times10^{-7}$ in./in./°C. over the range of 25° C. to 1000° C., and wherein RO consists essentially of one member selected from the group consisting of NiO, CoO, FeO, MnO and $TiO_2$, the NiO when selected being less than 25% by weight of the RO, the CoO when selected being less than 15% by weight of the RO, the FeO when selected being less than 40% by weight of the RO, the MnO when selected being less than 98% by weight of the RO, the $TiO_2$ when selected being less than 15% by weight of the RO, and the balance of the RO being substantially all MgO, said anisotropic, polycrystalline sintered ceramic product being relatively non-abrasive and free of ionic contaminants and imparting to said epoxy molding composition a linear coefficient of thermal expansion below the glass transition temperature of less than $23\times10^{-6}$° C. and a thermal conductivity greater than $25\times10^{-4}$ cal./°C./cm./sec.

The anisotropic, polycrystalline sintered ceramic product useful in the present invention is fully described in U.S. Pat. No. 3,885,977, the disclosure of which is expressly incorporated herein. The inventive concept of this patent relates to the discovery that the orientation of cordierite crystallites in a fired ceramic within a compositional area of 41–56.5% $SiO_2$, 30–50% $Al_2O_3$ and 9–20% MgO provides a very low expansion parallel to the oriented c-axes of the crystals. The resultant monolithic fired ceramic product in honeycomb form is said to be particularly adapted for use as a catalyst support matrix for emissions control.

This invention also relates to a process for preparing an epoxy molding composition capable of conversion to a thermoset condition upon application of heat and pressure and suitable for encapsulating microelectronic devices, said composition having a linear coefficient of thermal expansion below the glass transition temperature of less than $23\times10^{-6}$/°C. and a thermal conductivity which is greater than $25\times10^{-4}$ cal./°C./cm./sec., said process comprising admixing an epoxy resin, hardener therefor and from about 40% to about 80% by weight based on total composition of filler, 25% to about 100% by weight of said filler being an anisotropic, polycrystalline sintered ceramic product having cordierite as its primary phase and consisting essentially on an analytical basis of 11.5 to 16.5% RO, 33 to 41% $Al_2O_3$ and 46.6 to 53% $SiO_2$ and having a coefficient of thermal expansion in at least one direction of less than $11.0\times10^{-7}$ in./in./°C. over the range of 25° C. to 1000° C., and wherein RO consists essentially of one member selected from the group consisting of NiO, CoO, FeO, MnO and $TiO_2$, and the NiO when selected being less than 25% by weight of the RO, the CoO when selected being less than 15% by weight of the RO, the FeO when selected being less than 40% by weight of the RO, the MnO when selected being less than 98% by weight of the RO, the $TiO_2$ when selected being less than 15% by weight of the RO, and the balance of the RO being substantially all MgO, said anisotropic polycrystalline sintered ceramic product being relatively non-abrasive and free of ionic contaminants, and subjecting said mixture to momentary heat and pressure to compact and densify same.

The invention also relates to a semiconductor device encapsulated with the improved epoxy molding composition hereinbefore described.

In one preferred embodiment, the RO component of said product is MgO and the polycrystalline sintered ceramic product constitutes essentially 100% by weight of the filler, although admixture with up to about 75% by weight with other fillers which do not impair the desired low coefficient of expansion and high conductivity is operable.

The epoxy resin component of the compositions of the present invention are those having more than one epoxide group and may be of any of those used in molding compositions, such as the diglycidyl ethers of bisphenol A, glycidyl ethers of phenol-formaldehyde resins, aliphatic, cycloaliphatic, aromatic and heterocyclic epoxies. These epoxy resins are commercially available under a variety of trademarks, such as "Epon", "Epi-Rez", "Genepoxy" and "Araldite", to name a few. Epoxylated novolac resins are also useful in this invention and are available commercially under the trademarks "Ciba ECN" and "Dow DEN". The epoxy resins disclosed in U.S. Pat. No. 4,042,550 are useful in the practice of this invention.

Hardeners, also known as curing agents, which may be used herein are any of those commonly used for the purpose of cross-linking the epoxy resin and causing it to form a hard and infusible mass. These hardeners are well known in the art and the use of any particular one or combination thereof and is not critical to the present invention.

Some hardeners or curing agents which may be used are the following:

ANHYDRIDES

Any cyclic anhydride of a dicarboxylic or other polycarboxylic acid suitable for crosslinking the epoxy resin at cure temperatures. These include, but are not limited to, the following: phthalic anhydride, tetrachlorophthalic anhydride, benzophenonetetracarboxylic dianhydride (BTDA), pyromellitic dianhydride (PMDA), the dianhydride of 1,2,3,4-cyclopentanetetracarboxylic acid (CPDA), trimellitic anhydride, trimellitic double anhydride, nadic anhydride i.e., endomethylene tetrahydrophthalic anhydride, chlorendic anhydride, hexahydrophthalic anhydride, and the like. Other useful anhydride curing agents are those available under the trademark "AMOCO", e.g., Amoco TMX 220 which is apparently the reaction product of trimellitic acid with the diacetic acid derivative of ethylene glycol, and Amoco TMX 330 which is the reaction product of triacetin with trimellitic anhydride.

NOVOLACS

Cresol or phenol novolacs are useful and are formed by reacting formaldehyde with cresols or with phenols to form condensates containing phenolic hydroxyl groups.

AMINES

Any of the polyamines commonly used are operable, such as for example, the diamines, including aromatic amines represented by methylene dianiline, m-phenylene diamine, and m-tolylene diamine.

Generally from about 10 to about 200%, preferably from about 20% to 100% of hardener, based on the stoichiometric amount of the epoxy group employed, is used.

A variety of adjuvants may be added to the epoxy molding composition to provide special properties. Thus, catalysts, mold release agents, pigments, flame retardants, and coupling agents are generally employed in addition to the epoxy resin, hardener and filler.

A catalyst functions to accelerate the rate of cure or hardening of the epoxy resin. Thus, although not essential to the hardening of the epoxy resin per se, a catalyst is useful commercially on a production basis as it shortens the length of time necessary to bring about the thermoset condition of the molding composition. Some catalysts which have been used are amines, such as dimethylamine, dimethylaminoethylphenol, metal halides such as boron trifluoride, zinc chloride, stannic chloride and the like; acetylacetonates and a variety of imidazoles. The quantity of catalyst employed may vary from about 0.05 to about 10% by weight of the epoxy resin. Mold release agents are useful to prevent sticking of the composition in the mold and provide easy release therefrom after a molding operation. Waxes such as carnauba, montan, and various silicones, polyethylenes and fluorinated compounds are employed. Certain metallic-fatty acid compounds such as zinc, magnesium and calcium stearates in addition to glyceryl-fatty acid compounds are also used. Other lubricants may be used where deemed necessary, although in many molding preparations it may not be necessary to incorporate a mold release agent in the epoxy composition itself.

The most widely used pigment or coloring agent for epoxy molding compositions is carbon black. As is readily understood, a great variety of pigments other than carbon black may be employed as desired for special coloring effects. Pigments which also serve as flame retardants include the metal-containing compounds where the metal is antimony, phosphorus, aluminum and bismuth. Organic halides are also useful for providing flame retardancy.

Coupling agents may also be used to improve water resistance or the wet electrical properties of the molding composition. The coupling agents of choice are generally silanes, commercially available from Dow Chemical Company under the designation "Z-6040", which has the formula $$(CH_3O)_3SI(CH_2)_3OCH_2CH\overset{O}{\overset{\diagdown}{-}}CH_2, \text{ and}$$
"Z-6070" - Methyl trimethoxy silane Silanes are also available from Union Carbide under the following designations:
A-162—Methyl triethyoxy silane
A-163—Methyl trimethoxy silane
A-172—Vinyl-tris-(2-methoxyethoxy) silane
A-186—Beta-[3,4-epoxy-cyclohexyl] ethyl trimethoxy silane
A-187—Gamma-glycidoxypropyl trimethoxy silane
A-1100—Gamma-aminopropyltriethoxy silane
Also useful are:
KBM-202—Diphenyl dimethoxy silane—available from SHINETSU CHEMICAL CO., and
PO-330—Phenyl trimethoxy silane—available from PETRARCH SYSTEMS, INC.

When used, the quantity employed is from about 0.05 to about 3 percent by weight based on epoxy molding composition.

The same effect of a low coefficient of thermal expansion below the glass transition temperature ($\alpha$) and a high termal conductivity ($\tau$) can be obtained by the use of the specific anisotropic, polycrystalline sintered ceramic product employed herein when said product is incorporated in molding compositions based upon silicones, phenolics, and silicone-epoxy hydrids, polyimides and polyphenylene sulfides, or the like.

For a more complete understanding of the present invention, reference is now made to the following specific examples illustrating the improved epoxy molding composition of this invention.

DESCRIPTION OF THE PREFERRED EMBODIMENTS

EXAMPLE 1

The following epoxy composition was prepared by dry blending the pulverized ingredients in the indicated proportions at ambient temperature until a homogeneous blend was obtained. For convenience, small quantities of catalyst, release agent, pigment and silane were added. The resulting mixture was then densified on a hot differential two-roll mill, cooled to room temperature and ground to provide an epoxy molding composition in coarse granular form which, for encapsulating purposes, can be converted to a thermoset condition by the application of heat and pressure. The specific anisotropic polycrystalline sintered ceramic filler of the present invention is referred to in this and following examples as "Present Filler".

| EPOXY MOLDING COMPOSITION | |
|---|---|
| Component | % By Weight |
| Polyglycidyl ether of o-cresol formaldehyde novolac (epoxy resin) | 18.25 |
| Phenol formaldehyde novolac (hardener) | 7.60 |
| Present Filler | 73.00 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The filler content of this and subsequent examples is held constant at 55% by volume because measurements of the linear coefficient of thermal expansion and of thermal conductivity are based on volume percent rather than weight percent. For example, the density of the Present Filler is 2.6 g./cc. The density of the remainder (27%) of the composition is about 1.18 g./cc. Therefore, the volume of Filler is equal to:

$$\frac{\frac{73}{2.6}}{\frac{73}{2.6} + \frac{27}{1.18}} = 55\%$$

This composition was tested for its thermal conductivity and for its linear coefficient of thermal expansion according to the following methods.

THERMAL CONDUCTIVITY

Thermal Conductivity is a measure of the capacity of a material for conducting heat. The Colora Thermoconductometer is used, based upon a method devised by Dr. J. Schroeder (Ger. Pat. No. 1,145,825) to measure the thermal conductivity of plastic materials.

In this method, a cylindrical sample of material is placed between two boiling chambers containing two different pure liquids having 10°–20° C. difference in boiling points. The liquid in the lower chamber is heated to boiling—the heat transfers through the material to boil the liquid in the upper chamber. The time is measured for a given quantity of heat to flow through the sample to cause 1 ml of liquid from the upper boiling chamber (cold side) to evaporate and condense in a burette. The time required to evaporate and condense 1 ml of liquid by passing heat through the sample is compared to a known standard.

To test for thermal conductivity, a $0.70'' \times \frac{1}{8}''$ disc of the material to be tested is molded. This disc is placed in the thermoconductometer and tested as aforesaid.

The thermal conductivity ($\tau$) of the plastic in cal./°C./cm./sec. is calculated as follows:

$$\lambda = \frac{Q}{t \cdot (T_A - T_B)} \cdot \frac{h}{F}$$

where

Q = heat of vaporization for 1 ml of liquid B.
t = time in seconds for distilling 1 ml.
$T_A$-$T_B$ = temperature difference in °C. which is given by the boiling points of the two liquids.
h = sample height in cm.
F = sample cross-section in cm$^2$ A $\tau$ value greater than $25 \times 10^{-4}$ is highly desirable for encapsulants for electronic devices.

The thermal conductivity was found to be $30 \times 10^{-4}$ cal./°C./cm./sec.

THERMAL EXPANSION

Linear coefficient of thermal expansion is a measure of reversible heat induced expansion of any material. A Thermal Mechanical Analyzer is used to measure the expansion characteristics of a molded epoxy or plastic composition.

Plastic materials at some temperature reach a glossy state where the polymer chains begin to relax. This temperature is referred to as the Glass Transition Temperature ($T_g$) of the plastic. The average coefficient of thermal expansion below $T_g$ is called $\alpha_1$. The average coefficient of thermal expansion above $T_g$ is called $\alpha_2$.

To determine $\alpha_1$, $\alpha_2$, and $T_g$ of a plastic material, a test specimen comprising a cylindrical sample $0.2'' \times 0.2''$ is molded in a transfer molding press using a temperature of 350° F. and a pressure of 1000 psi. This test specimen is post cured at a temperature and for a period of time predetermined for each material.

The post cured specimen is then placed into the quartz tube chamber of the Thermal Mechanical Analyzer. A quartz displacement probe is positioned on top of the specimen. The chamber is then heated at a predetermined rate (usually 5° C./minute). The expansion of the plastic is sensed by a transducer which transfers the information to an X Y recorder. The Thermogram produced shows displacement versus temperature.

To determine $T_g$, the best tangent lines for the lower part of the displacement/temperature curve and the upper section are drawn. The temperature at the intersection of these two tangent lines is the glass transition temperature.

$\alpha_1$ and $\alpha_2$ can be calculated as follows:

$$\alpha = \frac{L_1 \times A}{L_o \times T} \times F$$

Where $\alpha$ = Average linear coefficient of thermal expansion in inches/inch/°C.
$L_1$ = Displacement in inches
A = Sensitivity of the Y' axis
$L_o$ = Original length of sample in inches
T = Temperature range used for determing TE
F = Calibration factor Although both $\alpha_1$ and $\alpha_2$ values are determined in this and in all subsequent examples, the $\alpha_1$ value, the linear coefficient of thermal expansion below the glass transition temperature ($T_g$) is the significant thermal expansion coefficient for evaluating the performance of epoxy molding compositions for encapsulating electronic devices. An $\alpha_1$ value less than $23 \times 10^{-6}$ is highly desirable for an encapsulant for electronic devices.

The values for $\alpha_1$, $\alpha_2$ and $T_g$ were found to be as follows:

$\alpha_1$—$18.3 \times 10^{-6}$/°C.
$\alpha_2$—$74.4 \times 10^{-6}$/°C.
$T_g$—164° C.

EXAMPLE 2

The composition and procedure of Example 1 were repeated except that crystalline silica was substituted for the Present Filler. The following results were obtained for $\alpha_1$, $\alpha_2$, $T_g$ and $\tau$:

$\alpha_1$—$30.1 \times 10^{-6}$
$\alpha_2$—$82.8 \times 10^{-6}$
$T_g$—159
$\tau$—$34 \times 10^{-4}$

EXAMPLE 3

The procedure of Example 1 was repeated with the following composition:

| Component | % By Weight |
| --- | --- |
| Polyglycidyl ether of o-cresol formaldehyde novolac (epoxy resin) | 14.10 |
| Phenol formaldehyde novolac (hardener) | 7.60 |
| Tabular alumina | 79.00 |
| 2-heptyldecyl imidazole (catalyst) | 0.20 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$16.2 \times 10^{-6}$
$\alpha_2$—$57.1 \times 10^{-6}$
$T_g$—178
$\tau$—$57 \times 10^{-4}$

EXAMPLE 4

The procedure of Example 1 was repeated with the following composition:

| Component | % By Weight |
| --- | --- |
| Polyglycidyl ether of o-cresol formaldehyde novolac (epoxy resin) | 17.95 |
| Phenol formaldehyde novolac (hardener) | 7.40 |
| Cordierite glass | 73.50 |
| 2-heptyldecyl imidazole (catalyst) | 0.25 |
| Carnauba wax (release agent) | 0.30 |

| Component | % By Weight |
|---|---|
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$23.0 \times 10^{-6}$
$\alpha_2$—$74.0 \times 10^{-6}$
$T_g$—155
$\tau$—$20 \times 10^{-4}$

EXAMPLE 5

The procedure of Example 1 was repeated with the following composition:

| Component | % By Weight |
|---|---|
| Polyglycidyl ether of o-cresol formaldehyde novolac (epoxy resin) | 17.45 |
| Phenol formaldehyde novolac (hardener) | 7.20 |
| Cordierite glass | 74.20 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$23.9 \times 10^{-6}$
$\alpha_2$—$79.0 \times 10^{-6}$
$T_g$—158
$\tau$—$26 \times 10^{-4}$

EXAMPLE 6

The procedure of Example 1 was repeated with the following composition:

| Component | % By Weight |
|---|---|
| Polyglycidyl ether of o-cresol formaldehyde novolac (epoxy resin) | 17.03 |
| Phenol formaldehyde novolac (hardener) | 7.05 |
| Wallastonite | 74.80 |
| 2-heptyldecyl imidazole (catalyst) | 0.22 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$22.6 \times 10^{-6}$
$\alpha_2$—$76.7 \times 10^{-6}$
$T_g$—167
$\tau$—$25 \times 10^{-4}$

EXAMPLE 7

The procedure of Example 1 was followed with the following composition:

| Component | % By Weight |
|---|---|
| Polyglycidyl ether of o-cresol formaldehyde novolac (epoxy resin) | 11.95 |
| Phenol formaldehyde novolac (hardener) | 4.95 |
| Zircon | 82.00 |
| 2-heptyldecyl imidazole (catalyst) | 0.20 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$24.0 \times 10^{-6}$
$\alpha_2$—$86.3 \times 10^{-6}$
$T_g$—164
$\tau$—$30 \times 10^{-4}$

EXAMPLE 8

The procedure of Example 1 was followed for the following composition:

| Component | % By Weight |
|---|---|
| Polyglycidyl ether of o-cresol formaldehyde novolac (epoxy resin) | 21.10 |
| Phenol formaldehyde novolac (hardener) | 8.70 |
| Fused Silica | 69.00 |
| 2-heptyldecyl imidazole (catalyst) | 0.30 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:
$\alpha_1$—$22.6 \times 10^{-6}$
$\alpha_2$—$77.6 \times 10^{-6}$
$T_g$—159
$\tau$—$17 \times 10^{-4}$ The results of Examples 1-8 are tabulated in Table 1.

TABLE 1

| COMPONENT | EXAMPLES | | | | | | | |
|---|---|---|---|---|---|---|---|---|
| | 1 | 2 | 3 | 4 | 5 | 6 | 7 | 8 |
| | | | | % By Weight | | | | |
| Polyglycidyl ether of o-cresol formaldehyde novolac | 18.25 | 18.25 | 14.10 | 17.95 | 17.45 | 17.03 | 11.95 | 21.10 |
| Formaldehyde novolac | 7.60 | 7.60 | 5.80 | 7.40 | 7.20 | 7.05 | 4.95 | 8.70 |
| Present Filler | 73.00 | | | | | | | |
| Crystalline Silica | | 73.00 | | | | | | |
| Tabular alumina | | | 79.00 | | | | | |
| Cordierite glass | | | | 73.50 | | | | |
| Cordierite crystal | | | | | 74.20 | | | |
| Wallastonite | | | | | | 74.80 | | |

TABLE 1-continued

| COMPONENT | EXAMPLES | | | | | | | |
|---|---|---|---|---|---|---|---|---|
| | 1 | 2 | 3 | 4 | 5 | 6 | 7 | 8 |
| | % By Weight | | | | | | | |
| Zircon | | | | | | | 82.00 | |
| Fused silica | | | | | | | | 69.00 |
| Additives* | 1.15 | 1.15 | 1.10 | 1.15 | 1.15 | 1.12 | 1.10 | 1.20 |
| $\alpha_1 \times 10^{-6}/°C.$ | 18.3 | 30.1 | 16.2 | 23.0 | 23.9 | 22.6 | 24.0 | 22.6 |
| $\alpha_2 \times 10^{-6}/°C.$ | 74.4 | 82.8 | 57.1 | 74.0 | 79.0 | 76.7 | 86.3 | 77.6 |
| $T_g$ (°C.) | 164 | 159 | 178 | 155 | 158 | 167 | 164 | 159 |
| $\tau \times 10^{-4}$ cal./°C./cm./sec. | 30 | 34 | 57 | 20 | 26 | 25 | 30 | 17 |

*The total of the catalyst, carnauba wax, carbon black and silane.

As summarized in Table 1, the compositions of Examples 1, 3, and 6 which respectively utilize the Present Filler, tabular alumina and Wallastonite exhibited ($\alpha_1$) values below $23 \times 10^{-6}/°C.$ and thermal conductivity ($\tau$) values above $25 \times 10^{-4}$ cal./cm./sec./°C. The compositions of Examples 2, 4, 5, 7 and 8 exhibited either ($\alpha_1$) values above $23 \times 10^{-6}/°C.$ or ($\tau$) values below $25 \times 10^{-4}$ cal./cm./sec./°C., and are therefore less useful where the dual properties of a low coefficient of thermal expansion and a high thermal conductivity are required.

The epoxy molding compound represented by Example 3 is of little practical significance primarily because of the excessive abrasiveness of tabular alumina that causes undesirable rapid wear of both manufacturing and molding equipment. The composition of Example 6 contains Wallastonite as a filler. This filler usually exhibits a high level of ionic contaminants such as sodium ion, and degrades reliability performance of the semiconductor devices encased therewith. The composition of Example 7 employs zircon as a filler which has a high dielectric constant and is often contaminated with heavy radioactive elements, making it undesirable as a component of an encapsulant for semiconductor devices. Only an epoxy molding compound that uses the Present Filler, as represented in Example 1, is of practical significance in encasing microelectronic devices since the Present Filler is essentially free from the defects pointed out for tabular alumina, Wallastonite and zircon. The compositions of Examples 4 and 5 utilize as fillers Cordierite Glass and Cordierite Crystal respectively in place of the Present Filler of Example 1. The overall chemical composition is similar for Cordierite Glass, Cordierite Crystal, and the Present Filler, their principal common constituent being high cordierite ($2MgO.2Al_2O_3.5SiO_2$), identified by its X-ray diffraction pattern. However, Cordierite Glass and Cordierite Crystal contain noticeable quantities of $\alpha$-quartz and spinel ($MgAl_2O_4$), while the Present Filler is free from such contaminants. Cordierite Crystal is less amorphous than Cordierite Glass, while the Present Filler is essentially pure high cordierite with its characteristic X-ray diffraction pattern.

EXAMPLE 9

The procedure of Example 1 was followed for the following composition:

| Component | % By Weight |
|---|---|
| Polyglycidyl ether of o-cresol formaldehyde novolac (epoxy resin) | 18.25 |
| Phenol formaldehyde novolac (hardener) | 7.60 |
| Present Filler | 36.50 |
| Crystalline silica | 36.50 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:

$\alpha_1$—$22.7 \times 10^{-6}$
$\alpha_2$—$82.6 \times 10^{-6}$
$T_g$—165
$\tau$—$34 \times 10^{-4}$ It is noted that the use of crystalline silica as the sole filler in Example 2 resulted in a $\alpha_1$ value which was $30.1 \times 10^{-6}$, an unacceptably high value, whereas the use of a combination of fillers consisting of crystalline silica and the Present Filler resulted in a reduction of the $\alpha_1$ value to a desirable value of $22.7 \times 10^{-6}$.

This demonstrates the usefulness and versatility of the Present Filler which can be used as the sole filler (100% of the total filler) in an epoxy molding composition, or can be admixed with other conventional fillers in a concentration ranging down to about 25% by weight of the total filler to impart the dual attributes of a low coefficient of thermal expansion below the glass transition temperature ($\alpha_1$) and a high thermal conductivity ($\tau$).

EXAMPLE 10

The procedure of Example 1 was followed with the following composition:

| Component | % By Weight |
|---|---|
| Polyglycidyl ether of o-cresol formaldehyde novolac (epoxy resin) | 15.85 |
| Phenol formaldehyde novolac (hardener) | 6.80 |
| Present Filler | 38.20 |
| Calcined alumina | 38.20 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The following results are obtained for $\alpha_1$, $\alpha_2$, $T_g$ and $\tau$:

$\alpha_1$—$17.3 \times 10^{-6}$
$\alpha_2$—$75.0 \times 10^{-6}$
$T_g$—169
$\tau$—$40 \times 10^{-4}$ This demonstrates that the Present Filler may be combined with calcined alumina to provide the desired $\alpha_1$, and $\tau$ values.

EXAMPLE 11

The procedure of Example 1 was followed with the following composition:

| Component | % By Weight |
|---|---|
| Polyglycidyl ether of o-cresol formaldehyde novolac (epoxy resin) | 19.65 |
| Phenol formaldehyde novolac (hardener) | 8.20 |
| Present Filler | 35.50 |
| Fused silica | 35.50 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:

$\alpha_1$—21×10$^{-6}$
$\alpha_2$—78.9×10$^{-6}$
$T_g$—163
$\tau$—22×10$^{-4}$

When fused silica was the sole filler, as in Example 8, the $\tau$ value was an unacceptable 17×10$^{-4}$. In the instance where the Present Filler is admixed with fused silica in a 1:1 ratio, the $\tau$ value is increased appreciably to the borderline acceptable level of 22×10$^{-4}$.

EXAMPLE 12

The procedure of Example 1 was followed with the following composition:

| Component | % By Weight |
|---|---|
| Polyglycidyl ether of o-cresol formaldehyde novolac (epoxy resin) | 17.55 |
| Phenol formaldehyde novolac (hardener) | 7.30 |
| Present filler | 37.00 |
| Wallastonite | 37.00 |
| 2-heptyldecyl imidazole (catalyst) | 0.25 |
| Carnauba wax (release agent) | 0.30 |
| Carbon black (pigment) | 0.20 |
| Silane "Z-6040" (coupling agent) | 0.40 |

The following results were obtained for $\alpha_1$, $\alpha_2$, $T_g$ and $\tau$:

$\alpha_1$—17.4×10$^{-6}$
$\alpha_2$—69.6×10$^{-6}$
$T_g$—172
$\tau$—25×10$^{-4}$ This example, when compared with Example 6, demonstrates the reduction in $\alpha_1$ value obtained by the use of a filler composition comprising an equal quantity of the Present Filler and Wallastonite.

EXAMPLES 13–15

These examples demonstrate that it is possible to use epoxy resins other than the polyglycidyl ether of O-cresol formaldehyde novolac and hardeners other than phenol formaldehyde novolac in the present epoxy molding compositions employing the Present Filler to obtain the desired $\alpha_1$ and $\tau$ values. The compositions and the results obtained by testing according to the methods described in Example 1 are tabulated in Table 2.

TABLE 2

| Component | Examples - % By Weight | | |
|---|---|---|---|
|  | 13 | 14 | 15 |
| Polyglycidyl ether of o-cresol formaldehyde novolac |  |  | 17.25 |
| Polyglycidyl ether of Phenol Formaldehyde novolac | 16.70 | 9.55 | 7.20 |
| Diglycidyl ether of bis-phenol A |  | 9.60 |  |
| Cresol formaldehyde novolac | 9.20 | 6.70 |  |
| Brominated diglycidyl ether of bis-phenol A |  |  | 1.40 |
| Present Filler | 73.00 | 73.00 | 72.00 |
| Antimony Oxide |  |  | 1.00 |
| 2-heptyldecyl imidazole | 0.20 | 0.25 | 0.25 |
| Carnauba wax | 0.30 | 0.30 | 0.30 |
| Carbon black | 0.20 | 0.20 | 0.20 |
| Z-6040 (silane) | 0.40 | 0.40 | 0.40 |
| $\alpha_1 \times 10^{-6}/°C$ | 19.7 | 17.0 | 16.8 |
| $\alpha_2 \times 10^{-6}/°C$ | 68.7 | 75.8 | 72.8 |
| $T_g$ - °C | 183 | 149 | 169 |
| $\tau \times 10^{-4}$ cal./°C./cm/sec. | 31 | 31 | 30 |

EXAMPLES 16–21

Examples 16–21 demonstrate that it is possible to use anhydrides or amines as hardeners for epoxy resins or mixtures of epoxy resins together with the Present Filler to obtain the desired $\alpha_1$ and $\tau$ values, even where the additives are different from those in Example 1. Similarly, the use of the same anhydride hardeners with the same epoxy resins in combination with fillers other than the Present Filler, i.e., in combination with crystalline silica or fused silica respectively, results in unacceptably high $\alpha_1$ and unacceptably low $\tau$ values.

The composition of Examples 16–21 and the results obtained by testing for $\alpha_1$ and $\tau$ values according to the methods described in Example 1 are tabulated in Table 3.

TABLE 3

| Component | % By Weight EXAMPLE | | | | | |
|---|---|---|---|---|---|---|
|  | 16 | 17 | 18 | 19 | 20 | 21 |
| Polyglycidyl ether of o-cresol formaldehyde novolac | 9.23 | 9.23 | 10.80 | 19.00 | 19.00 | 21.80 |
| Diglycidyl ether of bis-phenol A | 12.96 | 12.96 | 15.10 | 3.30 | 3.30 | 3.80 |
| Benzophenone tetra carboxylic dianhydride | 5.76 | 5.76 | 6.00 |  |  |  |
| Methylene dianiline |  |  |  | 4.90 | 4.90 | 5.60 |
| Present Filler | 69.50 |  |  | 69.00 |  |  |
| Crystalline silica (α quartz) |  | 69.50 |  |  | 69.00 |  |
| Fused Silica |  |  | 65.20 |  |  | 65.20 |

TABLE 3-continued

| | % By Weight | | | | | |
|---|---|---|---|---|---|---|
| | EXAMPLE | | | | | |
| Component | 16 | 17 | 18 | 19 | 20 | 21 |
| Zinc Stearate | 1.90 | 1.90 | 2.00 | | | |
| Carbon black | 0.19 | 0.19 | 0.20 | 0.30 | 0.30 | 0.30 |
| Z-6040 (silane) | 0.28 | 0.28 | 0.30 | | | |
| Stearyl alcohol | 0.38 | 0.38 | 0.40 | | | |
| Chlorendic anhydride | | | | 1.50 | 1.50 | 1.50 |
| Calcium stearate | | | | 2.00 | 2.00 | 2.00 |
| $\alpha_1 \times 10^{-6}/°C.$ | 21.5 | 34.7 | 27.4 | 21.1 | 30.6 | 24.5 |
| $\alpha_2 \times 10^{-6}/°C.$ | 85.9 | 82.8 | 86.6 | 76.9 | 78.2 | 73.5 |
| $T_g$ | 177 | 153 | 166 | 179 | 176 | 173 |
| $\tau \times 10^{-4}$ cal./°C./cm./sec. | 28 | 32 | 17 | 25 | 28 | 15 |

Examples 16 and 19 show that the Present Filler can be used with a combination of epoxy resins, anhydride hardener and an amine hardener respectively to obtain a low $\alpha_1$ and a high $\tau$ value. Example 17 is identical in composition to Example 16 with the exception that the filler is crystalline silica instead of the Present Filler, with the result that the $\alpha_1$ value is unacceptably high.

Example 18 is similar in composition to Example 16, except that the filler is fused silica instead of the Present Filler. Here again, the $\alpha_1$ value is too high for use in an epoxy molding composition for a semiconductor or other electronic devices.

Examples 20 and 21 are similar in composition to that of Example 19 except that the fillers in Examples 20 and 21 are crystalline silica and fused silica respectively. The $\alpha_1$ values of Examples 20 and 21 are too high and the $\alpha$ value of Example 21 is too low.

What is claimed is:

1. In an epoxy molding composition capable of conversion to a thermoset condition upon application of heat and pressure and suitable for encapsulating micro electronic devices, said composition comprising epoxy resin, hardener therefor and from about 40% to about 80% by weight based on total composition of filler, the improvement wherein from about 25% to about 100% by weight of the filler is an anisotropic, polycrystalline sintered ceramic product having cordierite as its primary phase and consisting essentially on an analytical oxide basis of 11.5 to 16.5% RO, 33 to 41% $Al_2O_3$ and 46.6 to 53% $SiO_2$ and having a coefficient of thermal expansion in at least one direction of less than $11.0 \times 10^{-7}$ in./in./°C. over the range of 25° to 1000° C., and wherein RO consists essentially of one member selected from the group consisting of NiO, CoO, FeO, MnO and $TiO_2$, the NiO when selected being less than 25% by weight of the RO, the CoO when selected being less than 15% by weight of the RO, the FeO when selected being less than 40% by weight of the RO, the MnO when selected being less than 98% by weight of the RO, the $TiO_2$ when selected being less than 15% by weight of the RO, and the balance of the RO being substantially all MgO, said anisotropic polycrystalline sintered ceramic product being relatively non-abrasive and free of ionic contaminants and imparting to said epoxy molding composition a linear coefficient of thermal expansion below the glass transition temperature of less than $23 \times 10^{-6}/°C.$ and a thermal conductivity greater than $25 \times 10^{-4}$ cal./°C./cm./sec.

2. The composition of claim 1 wherein RO consists essentially of MgO.

3. The composition of claim 1 wherein about 100% by weight of the filler is said anisotropic, polycrystalline sintered ceramic product.

4. In an epoxy molding composition capable of conversion to a thermoset condition upon application of heat and pressure and suitable for encapsulating microelectronic devices, said composition comprising epoxy resin, hardener therefor and from about 40% to 80% by weight based on total composition of filler, the improvement wherein from about 25% to about 100% by weight of the filler is an anisotropic, polycrystalline sintered ceramic product having cordierite as its primary phase and consisting essentially on an analytical oxide basis of 11.5 to 16.5% MgO, 33 to 41% $Al_2O_3$ and 46.6 to 53% $SiO_2$ and having a coefficient of thermal expansion in at least one direction of less than $11.0 \times 10^{-7}$ in./in./°C. over the range of 25° to 1000° C., said anisotropic polycrystalline sintered ceramic product being relatively nonabrasive and free of ionic contaminants and imparting to said epoxy molding composition a linear coefficient of thermal expansion below the glass transition temperature of less than $23 \times 10^{-6}/°C.$ and a thermal conductivity greater than $25 \times 10^{-4}$ cal./°C./cm/sec.

5. The composition of claim 4 wherein about 100% by weight of the filler is said anisotropic polycrystalline sintered ceramic product.

6. A process for preparing an epoxy molding composition capable of conversion to a thermoset condition upon application of heat and pressure and suitable for encapsulating microelectronic devices, said composition having a linear coefficient of thermal expansion below the glass transition temperature of less than $23 \times 10^{-6}/°C.$ and a thermal conductivity which is greater than $25 \times 10^{-4}$ cal./°C./cm./sec., said process comprising admixing an epoxy resin, hardener therefor and from about 40% to about 80% by weight based on total composition of filler, 25% to about 100% by weight of said filler being an anisotropic, polycrystalline sintered ceramic product having cordierite as its primary phase and consisting essentially on an analytical basis of 11.5 to 16.5% RO, 33 to 41% $Al_2O_3$ and 46.6 to 53% $SiO_2$ and having a coefficient of thermal expansion in at least one direction of less than $11.0 \times 10^{-7}$ in./in./°C. over the range of 25° to 1000° C., and wherein RO consists essentially of one member selected from the group consisting of NiO, CoO, FeO, MnO and $TiO_2$, and the NiO when selected being less than 25% by weight of the RO, the CoO when selected being less than 15% by weight of the RO, the FeO when selected being less than 40% by weight of the RO, the MnO when selected being less than 98% by weight of the RO, the $TiO_2$ when selected being less than 15% by weight of the RO, and the balance of the RO being substantially all MgO, said anisotropic polycrystalline sintered ceramic product being relatively non-abrasive and free of ionic contaminants, and subjecting said mixture to momentary heat and pressure to compact and densify same.

7. The process of claim 6 wherein the RO consists essentially of MgO.

8. The process of claim 6 wherein about 100% by weight of the filler is said anisotropic polycrystalline sintered ceramic product.

9. The process of claim 7 wherein about 100% by weight of the filler is said anisotropic polycrystalline sintered ceramic filler.

10. A semiconductor device encapsulated with the thermoset composition of claim 1.

* * * * *